US008075106B2

(12) United States Patent
Miyata et al.

(10) Patent No.: US 8,075,106 B2
(45) Date of Patent: Dec. 13, 2011

(54) LIQUID EJECTING HEAD AND LIQUID EJECTING APPARATUS

(75) Inventors: Yoshinao Miyata, Matsukawa-machi (JP); Kazutoshi Goto, Matsumoto (JP); Satoshi Nakajima, Okaya (JP); Toshiaki Kori, Suwa (JP); Tomoaki Takahashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 371 days.

(21) Appl. No.: 12/367,364

(22) Filed: Feb. 6, 2009

(65) Prior Publication Data

US 2009/0201346 A1 Aug. 13, 2009

(30) Foreign Application Priority Data

Feb. 8, 2008 (JP) ................................ 2008-029800
Sep. 29, 2008 (JP) ................................ 2008-251844

(51) Int. Cl.
*B41J 2/045* (2006.01)
*H01L 21/00* (2006.01)

(52) U.S. Cl. ........................................... 347/71; 438/21

(58) Field of Classification Search ..................... 438/21
See application file for complete search history.

(56) References Cited

U.S. PATENT DOCUMENTS 5,889,539 A * 3/1999 Kamoi et al. .................. 347/50

FOREIGN PATENT DOCUMENTS

JP 2004-148813 5/2004

* cited by examiner

*Primary Examiner* — Matthew Luu
*Assistant Examiner* — Lisa Solomon
(74) *Attorney, Agent, or Firm* — Workman Nydegger

(57) ABSTRACT

A liquid ejecting head which includes a flow passage forming substrate that has pressure generating chambers which communicate with nozzles capable of ejecting a liquid, pressure generating elements which apply pressure to the pressure generating chambers in order to eject the liquid from the nozzles, lead electrodes that supply electric signals to the pressure generating elements, wiring substrates that supply the electric signals to the lead electrodes, and a supporting member that supports the wiring substrates so as to raise the wiring substrates from a surface of the liquid ejecting head having the lead electrodes provided thereon.

17 Claims, 5 Drawing Sheets

LIQUID EJECTING HEAD AND LIQUID EJECTING APPARATUS

The entire disclosures of Japanese Patent Application Nos. 2008-029800, filed Feb. 8, 2008 and 2008-251844, filed Sep. 29, 2008 are expressly incorporated herein by reference.

BACKGROUND OF THE INVENTION

1. Technical Field

The present invention relates to a liquid ejecting head and a liquid ejecting apparatus. More particularly, the present invention relates to an ink jet recording head capable of discharging a liquid ink from a plurality of nozzles.

2. Related Art

One example of a liquid ejecting head currently known in the art is an ink jet recording head that discharges ink as a plurality of ink droplets. Typically, an ink jet recording head includes a flow passage forming substrate that has pressure generating chambers which communicate with nozzles and a communicating portion which communicates with the pressure generating chambers, piezo-electric elements that are formed on one surface of the flow passage forming substrate, and a protective substrate that is bonded to one surface of the flow passage forming substrate which includes piezo-electric element holding portions for holding the piezo-electric elements. In addition, an IC, which is a driving circuit for driving the piezo-electric elements, is provided on the protective substrate. A driving circuit and the piezo-electric elements are connected to each other by connection lines composed of conductive wires through lead electrodes, which extend from one electrode of the piezo-electric using a wire bonding method.

The protective substrate protects two rows of piezo-electric elements which correspond to two rows of pressure generating chambers, with a through hole formed at the center of the protective substrate through which the connection lines pass. In the ink jet recording head disclosed in Japanese Patent Application No. JP-A-2004-148813, for example, the lead electrodes and the conductive wires are connected to each other in the through hole.

One problem with such configurations, however, is that the wire bonding method used to connect the driving circuit and the piezo-electric elements makes it difficult to reduce the size of the ink jet recording head. In addition, since the driving circuit is formed parallel to the protective substrate, the area of an actuator including the piezo-electric elements is increased.

In addition, these problems arise in other liquid ejecting heads which eject liquid materials other than ink.

BRIEF SUMMARY OF THE INVENTION

An advantage of some aspects of the invention is that provides a liquid ejecting head and a liquid ejecting apparatus having a compact size.

A first aspect of the invention comprises a liquid ejecting head which includes a flow passage forming substrate including pressure generating chambers which are capable of communicating with nozzles for ejecting a liquid provided therein, pressure generating elements capable of applying pressure to eject the liquid in the pressure generating chambers, lead electrodes capable of supplying electric signals to the pressure generating elements, wiring substrates capable of supplying the electric signals to the lead electrodes, and a supporting member that supports the wiring substrates so as to raise the wiring substrates from a surface of the liquid ejecting head having the lead electrodes provided thereon.

A second aspect of the invention comprises a liquid ejecting apparatus which includes the liquid ejecting head described above.

A third aspect of the invention is a method of manufacturing a liquid ejecting head with wiring substrates electrically connected to lead electrodes in a liquid ejecting head member including a flow passage forming substrate that has includes pressure generating chambers communicating with nozzles capable of ejecting a liquid provided therein, pressure generating elements capable of applying pressure which causes the liquid to the pressure generating chambers to be ejected from the nozzles, where the lead electrodes supply electric signals to the pressure generating elements. The method comprises fixing the wiring substrates to a supporting member to support the wiring substrates, aligning the lead electrodes of the liquid ejecting head member with the wiring substrates, and pressing connecting portions between the aligned lead electrodes and the wiring substrates so as to electrically connect the lead electrodes and the wiring substrates.

One advantage of the aspects of the invention is that the lead electrodes of the piezo-electric elements are connected to the wiring substrates, making it possible to easily reduce the size of a liquid ejecting head as compared to the wire bonding method currently used that performs bonding on each wiring line using a bonding tool. In addition, since the wiring substrate is supported by the supporting member, causing it to be raised from the surface of the liquid ejecting head where the lead electrodes are provided, it is possible to easily achieve a reduction in the size of a liquid ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described in detail with reference to the accompanying drawings.

Figure 1:
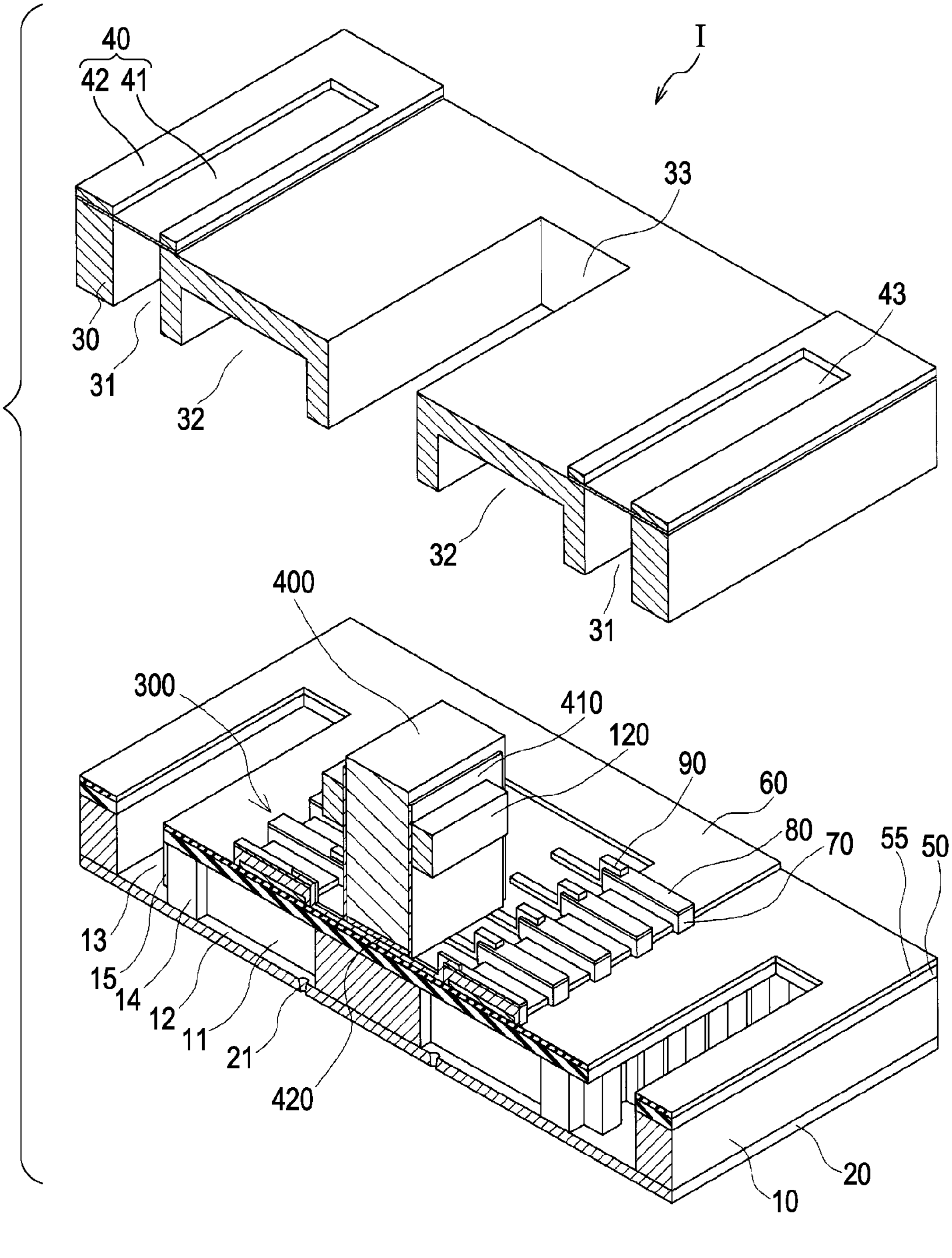
FIG. 1 is an exploded perspective view illustrating a recording head according to a first embodiment of the invention.
Figure 2A:
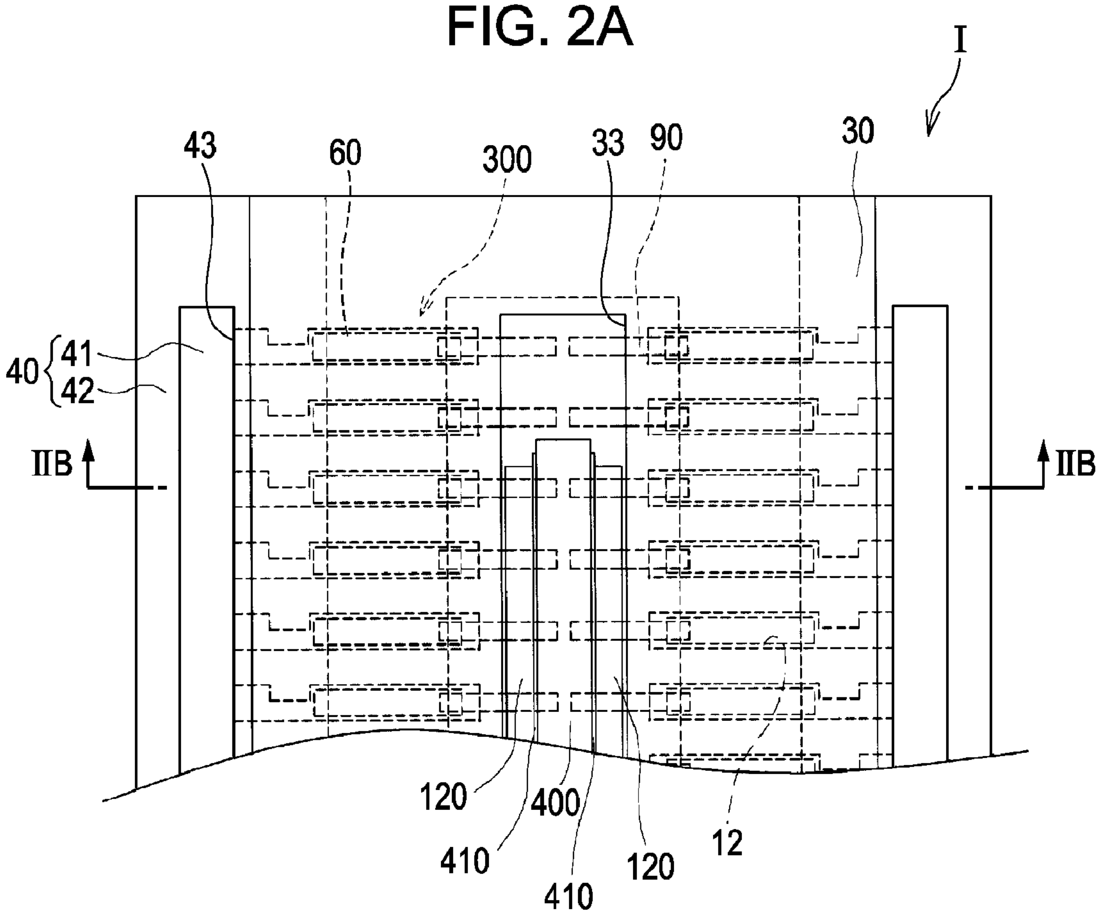
FIG. 2A is a plan view illustrating the recording head according to the first embodiment of the invention.

FIG. 1 is an exploded perspective view which illustrates the structure of an ink jet recording head, which is an example of a liquid ejecting head I capable of performing aspects of the invention according to a first embodiment. FIG. 2A is a plan view of FIG. 1, and FIG. 2B is a cross-sectional view taken along the line IIB-IIB of FIG. 1.

Figure 2B:
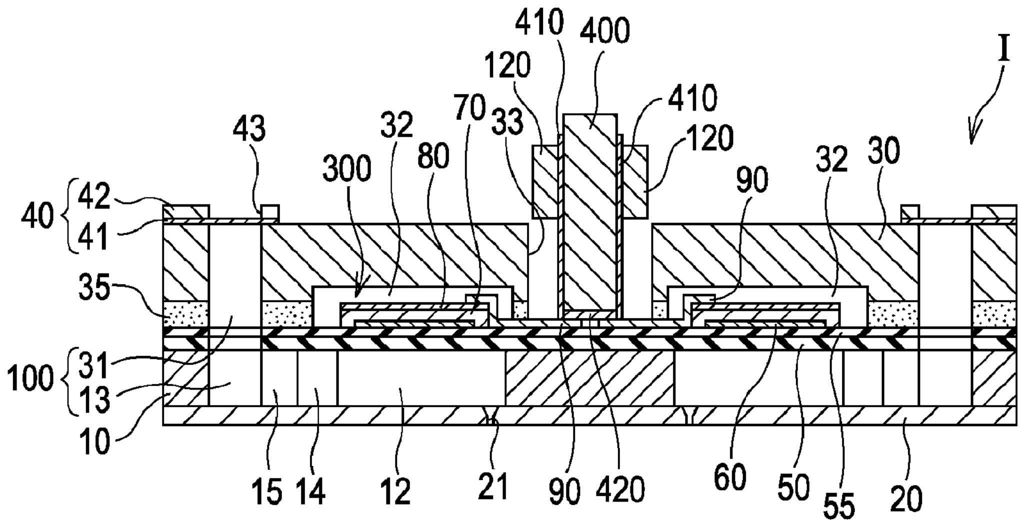
FIG. 2B is a cross-sectional view illustrating the recording head according to the first embodiment of the invention.

As shown in FIGS. 1, 2A and 2B, the liquid ejecting head I includes a flow passage forming substrate 10 comprising a (110) silicon single crystal substrate, and an elastic film 50 made of a silicon dioxide formed on one surface of the flow passage forming substrate.

Two rows of pressure generating chambers 12 are provided in the width direction of the flow passage forming substrate 10. In addition, a communicating portion 13 is formed in the region outside each row of pressure generating chambers 12 in the longitudinal direction of the flow passage forming substrate 10. The communicating portion 13 and each of the pressure generating chambers 12 communicate with each other through an ink supply passage 14 and a communicating passage 15 provided in each of the pressure generating chambers 12. The communicating portion 13 communicates with a reservoir portion 31 of a protective substrate 30, which is described more fully below, in order to form a portion of a reservoir 100 which serves as an ink chamber that is common to the two rows of pressure generating chambers 12. The ink supply passage 14 has a width that is smaller than that of the pressure generating chamber 12, which keeps the flow resistance of ink flowing from the communicating portion 13 into the pressure generating chamber 12 constant. In this embodiment, the ink supply passage 14 is formed by reducing the width of the flow passage by extending one wall of the flow passage substrate 10 into the ink supply passage 14. However, the ink supply passage may be formed by extending both walls of the flow passage substrate 10 into the ink supply passage 14. In addition, the ink supply passage may be formed by reducing the thickness of the flow passage without reducing the width thereof. Each of the communicating passages 15 is formed by extending both partition walls 11 of the pressure generating chamber 12 to the communicating portion 13 in order to partition a space between the ink supply passage 14 and the communicating portion 13. That is, in the flow passage forming substrate 10, the ink supply passage 14 has a cross section in the width direction that is smaller than that of the pressure generating chamber 12 and the communicating passage 15 that communicates with the ink supply passage 14 has a cross section in the width direction that is larger than that of the ink supply passage 14. Both the ink supply passage 14 and the communicating passage 15 partitioned by a plurality of partition walls 11.

A nozzle plate 20 having nozzles 21 formed therein is fixed to an opened surface of the flow passage forming substrate 10 by, for example, an adhesive or a thermal bonding film. Each nozzle communicates with an end of the corresponding pressure generating chamber 12 opposite to the ink supply passage 14. In this embodiment, since two rows of pressure generating chambers 12 are formed in the flow passage forming substrate 10, two rows of nozzles 21 are provided in one ink jet recording head I. The nozzle plate 20 is formed of, for example, glass ceramics, silicon single crystal, or stainless steel.

As described above, the elastic film 50 is formed on a surface of the flow passage forming substrate 10 opposite to the surface where the nozzles 21 are formed. An insulating film 55 is formed on the elastic film 50. In addition, a lower electrode film 60, a piezo-electric layer 70, and an upper electrode film 80 are formed on the insulating film 55 using a process described more fully below, in order to form a piezo-electric element 300. The piezo-electric element 300 includes the lower electrode film 60, the piezo-electric layer 70, and the upper electrode film 80. In general, one electrode of the piezo-electric element 300 serves as a common electrode, and the other electrode thereof and piezo-electric layer 70 are formed in each pressure generating chamber 12 by patterning. In this embodiment, a piezo-electric active portion includes the patterned electrode and the piezo-electric layer 70, such that when a voltage is applied between two electrodes, voltage distortion occurs in the piezo-electric active portion. In this embodiment, the lower electrode film 60 is used as the common electrode of the piezo-electric element 300, and the upper electrode film 80 is used as an individual electrode of the piezo-electric element 300. However, the electrode structure may be reversed according to a driving circuit and wiring lines. Further, in this embodiment, the piezo-electric element 300 and a diaphragm that is deformed by the driving of the piezo-electric element 300 are referred to collectively as an actuator. In this embodiment, the elastic film 50, the insulating film 55, and the lower electrode film 60 serve as the diaphragm, but the invention is not limited thereto. For example, the elastic film 50 and the insulating film 55 may not be provided, and the diaphragm may be comprised of only the lower electrode film 60. In addition, the piezo-electric element 300 may also serve as the diaphragm.

The piezo-electric layer 70 is formed on the lower electrode film 60 and is made of a piezo-electric material, which is an electro-mechanical conversion material. The piezo-electric layer 70 is preferably formed of a crystal film having a perovskite structure. For example, it is preferable that the piezo-electric layer 70 be formed of a ferroelectric material, such as lead zirconate titanate (PZT), or a mixture of PZT and a metal oxide, such as a niobium oxide, a nickel oxide, or a magnesium oxide.

A lead electrode 90 made of, for example, gold (Au) is connected to one end of each upper electrode film 80, which is an individual electrode of the piezo-electric element 300. More specifically, the lead electrode is connected to the end of each upper electrode film 80 opposite to the ink supply passage 14, and extends onto the insulating film 55. However, the upper electrode film 80 may extend as the lead electrode 90.

A protective substrate 30 having a reservoir portion 31 that forms at least a portion of the reservoir 100 is bonded to the upper surface of the flow passage forming substrate 10 having the piezo-electric elements 300 formed therein by an adhesive 35. In this embodiment, the reservoir portion 31 is formed so as to pass through the protective substrate 30 in the thickness direction and extend in the width direction of the pressure generating chamber 12. In addition, the reservoir portion 31 communicates with the communicating portion 13 of the flow passage forming substrate 10 to form the reservoir 100, which is an ink chamber common to the pressure generating chambers 12. However, the communicating portion 13 of the flow passage forming substrate 10 is divided into a plurality of portions corresponding to the pressure generating chambers 12, and only the reservoir portion 31 serves as the reservoir. In addition, for example, only the pressure generating chambers 12 are formed in the flow passage forming substrate 10, and the ink supply passage 14 that allows the reservoir to communicate with the pressure generating chambers 12 may be formed in a member interposed between the flow passage forming substrate 10 and the protective substrate 30, such as, for example, the elastic film 50 or the insulating film 55.

Piezo-electric element holding portions 32 are provided in a region of the protective substrate 30 opposite to the piezo-electric element 300, each having a shape so that the operation of the piezo-electric element 300 is not hindered. The piezo-electric element holding portion 32 may or may not be sealed.

The protective substrate 30 is preferably formed of a material having a thermal expansion coefficient that is substantially equal to that of the flow passage forming substrate 10, such as glass or a ceramic material. In this embodiment, a silicon single crystal substrate that is made of the same material as that forming the flow passage forming substrate 10 is used as the protective substrate 30.

In addition, a through hole 33 passing through the protective substrate 30 in the thickness direction is provided in the protective substrate 30. Therefore, the ends of the lead electrodes 90 extending from the piezo-electric elements 300 are exposed through the through hole 33.

Driving circuits 120 that drive the piezo-electric elements 300 are mounted on COF substrates 410, which are wiring substrates. The COF substrates 410 are provided substantially in the vertical direction with the lower ends thereof connected to the lead electrodes 90 and fixed to the side surfaces of a supporting member 400. In this embodiment, the supporting member 400 is a rectangular parallelepiped having vertical side surfaces.

Specifically, in the ink jet recording head I according to this embodiment, two rows of pressure generating chambers 12 are provided in the flow passage forming substrate 10, and two rows of piezo-electric elements 300 are provided in the width direction of the pressure generating chamber 12. That is, two rows of the pressure generating chambers 12, piezo-electric elements 300, and the lead electrodes 90 are arranged opposite to each other in a symmetrical configuration. In addition, two COF substrates 410 are fixed to both side surfaces of the supporting member 400 having a lower part inserted into the through hole 33, and each of the COF substrates 410 is provided substantially in the vertical direction with the lower end thereof connected to the lead electrodes 90. A buffer member 420 that is preferably made of Teflon® is provided on a lower surface of a SUS member of the supporting member 400. The lower ends of the COF substrates 410 and the lead electrodes 90 are electrically connected to each other by conductive particles included in an anisotropic conductive layer, such as an anisotropic conductive film or an anisotropic conductive paste.

More specifically, after the anisotropic conductive layer is formed on the lead electrodes 90, the positions of the lead electrodes 90 and the COF substrates 410 fixed to the supporting member 400 are adjusted so that the corresponding wiring lines are opposite to each other, and the supporting member 400 is pressed such that the lower surface of the supporting member presses the COF substrates 410 against the lead electrodes 90. In this way, predetermined electrical connection is made between the COF substrates 410 and the lead electrodes 90 by conductive particles. In this case, the buffer member 420 functions to apply a uniform pressing force to the COF substrates 410. It is preferable that the lower surface of the supporting member 400 and the lower ends of the COF substrates 410 have a profile irregularity that is less than five times the diameter of the conductive particle. In this case, it is possible to apply a uniform pressing force to the conductive particles using the buffer member 420 and the lower ends of the COF substrates 410. As a result, it is possible to reliably press the conductive particles to ensure good electrical connection.

It is preferable that the supporting member 400 be formed of a material having a thermal conductivity capable of reducing the temperature of the driving circuit to be lower than a junction temperature even when the ink jet recording head I is operating at a maximum operation temperature at which the ink jet recording head I is guaranteed to operate. In this case, a sufficient dissipation effect is obtained even when the driving circuit is operated under the most severe load conditions. As a result, it is possible to stably operate the driving circuit for a long time. For this reason, in this embodiment, the supporting member 400 is formed of a SUS material. In this case, ink flowing through the flow passage forming substrate 10 can absorb heat generated from the driving circuits 120 through the supporting member 400. As a result, it is possible to effectively dissipate heat generated from the driving circuits 120. The above-mentioned effect and operation can be obtained by sufficiently reducing the distance between the surface of the flow passage forming substrate 10 and the driving circuit 120 or mounting the driving circuits 120 to the COF supporting member 400, even when a metal material, such as SUS, is not used. That is, it is preferable that the distance between the driving circuit 120 and the surface of the flow passage forming substrate 10 be set to a value so that the ink is capable of dissipating heat from the driving circuit 120 so that the temperature of the driving circuit 120 is lower than its junction temperature even when the liquid ejecting head I is used at the maximum operation temperature, or the driving circuit be directly connected to the supporting member 400.

A compliance substrate 40 including a sealing film 41 and a fixing plate 42 is bonded to the protective substrate 30. The sealing film 41 is formed of a material having low rigidity and flexibility, such as, for example, polyphenylene sulfide (PPS), and the sealing film 41 seals one surface of the reservoir portion 31. The fixing plate 42 is formed of a hard material, such as metal, for example, stainless steel (SUS). A region of the fixing plate 42 opposite to the reservoir 100 forms an opening portion 43 that is formed in the thickness direction. Therefore, one surface of the reservoir 100 is sealed by only the flexible sealing film 41.

In the ink jet recording head according to this embodiment, ink is drawn from an ink inlet connected to an external ink supply unit (not shown), causing a space from the reservoir 100 to the nozzles 21 to fill with ink. Then, a voltage is applied between the lower electrode film 60 and the upper electrode film 80 corresponding to each pressure generating chamber 12 according to recording signals transmitted from the driving circuit 120. This causes the elastic film 50, the insulating film 55, the lower electrode film 60, and the piezo-electric layer 70 to deform. Then, the internal pressure of each pressure generating chamber 12 is increased, and ink droplets are discharged from the nozzles 21.

Further, according to this embodiment, the driving circuits 120 and the lead electrodes 90 of the piezo-electric elements 300 are connected to each other by the COF substrates 410 having the driving circuits 120 mounted thereon. Therefore, it is possible to more easily manufacture an ink jet recording head, as compared to the wire bonding method currently used in the art. In addition, since the COF substrate 410 is provided substantially in the vertical direction with its lower end connected to the lead electrodes 90, it is possible to easily achieve a reduction in the size of an ink jet recording head. Further, since the driving circuits 120 are fixed to the side surfaces of the supporting member 400 with the COF substrates 410 interposed therebetween, it is possible to effectively dissipate heat generated from the driving circuits 120.

Figure 3:
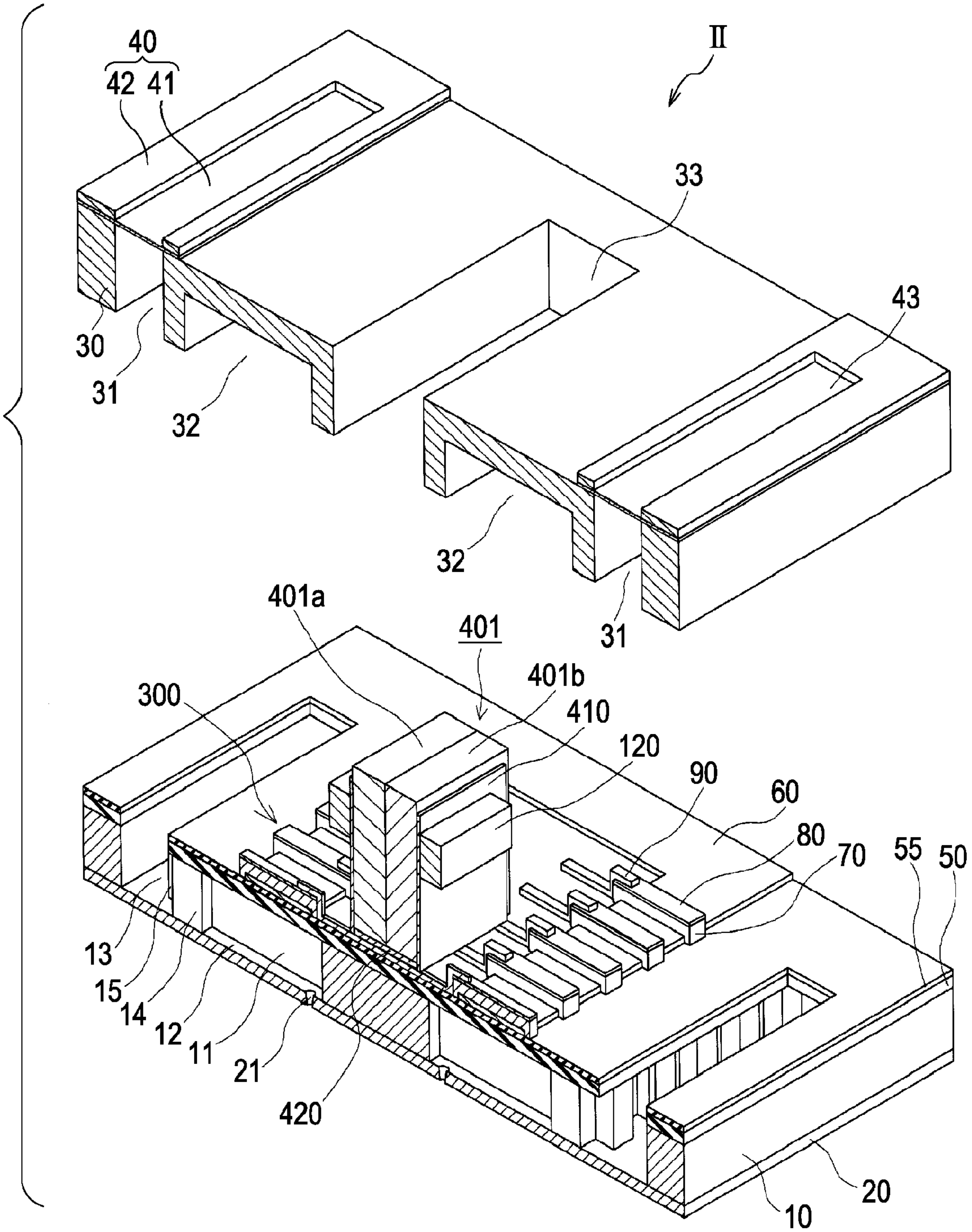
FIG. 3 is an exploded perspective view illustrating a recording head according to a second embodiment of the invention.
Figure 4A:
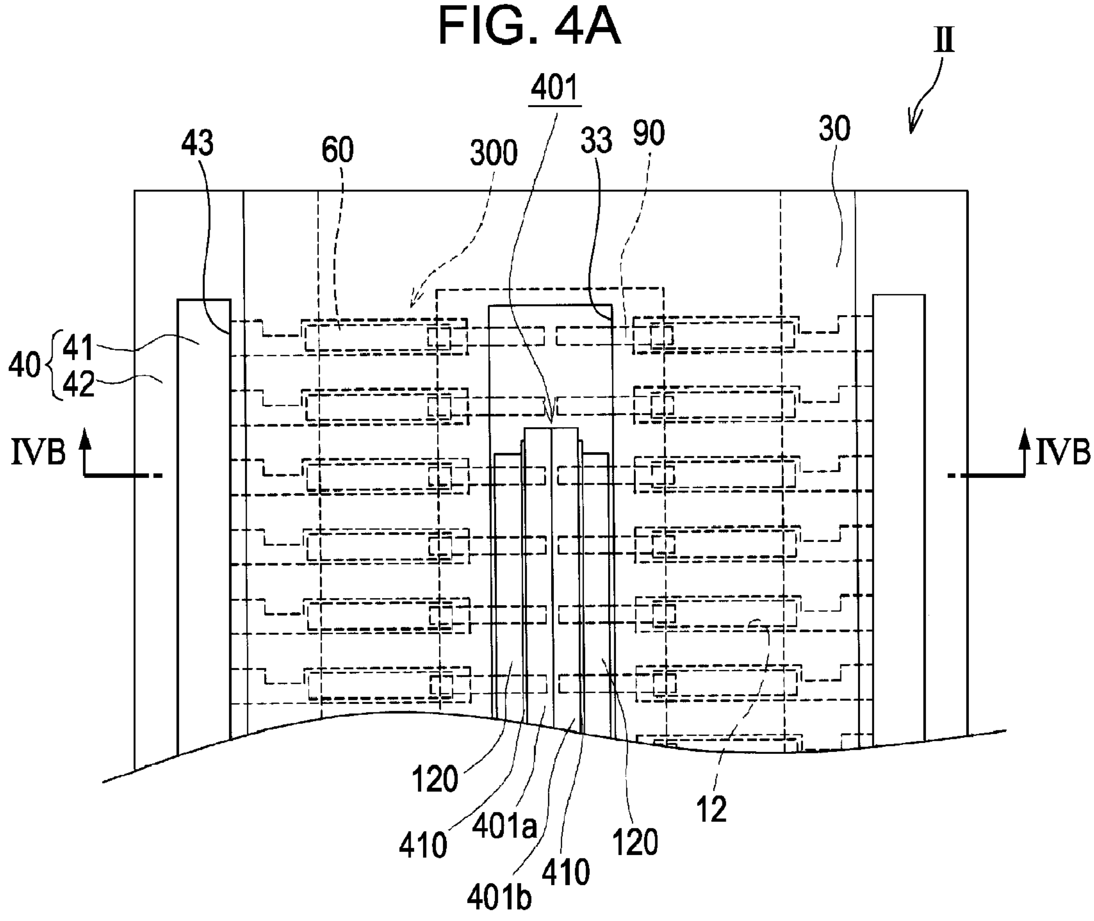
FIG. 4A is a plan view illustrating the recording head according to the second embodiment of the invention.

FIG. 3 is an exploded perspective view schematically illustrating the structure of an ink jet recording head II, which is an example of a liquid ejecting head according to a second embodiment of the invention. FIG. 4A is a plan view of FIG. 3, and FIG. 4B is a cross-sectional view taken along the line IVB-IVB of FIG. 3.

Figure 4B:
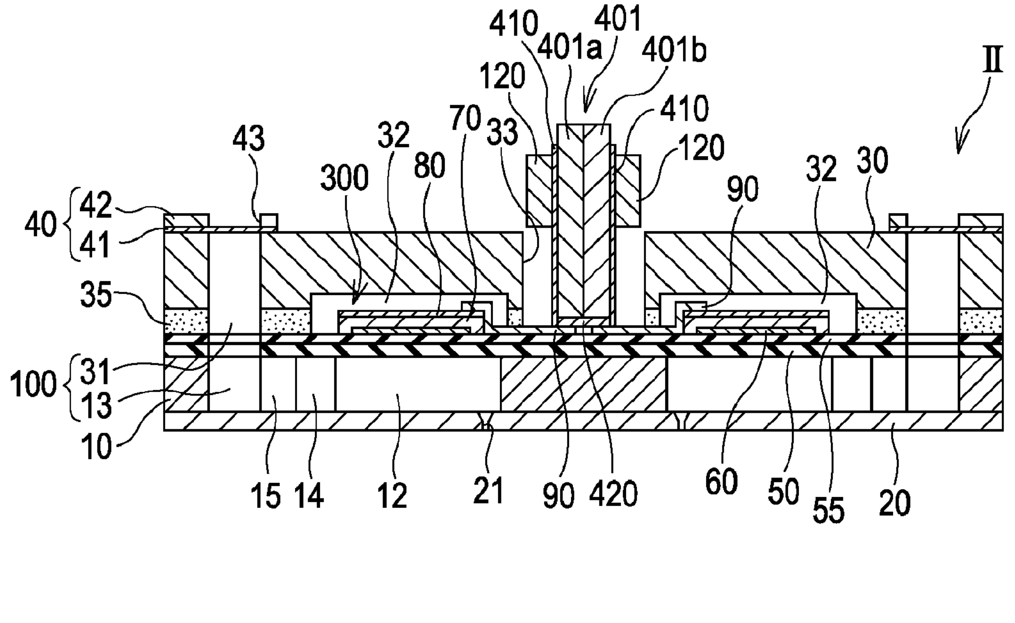
FIG. 4B is a cross-sectional view illustrating the recording head according to the second embodiment of the invention.

As shown in FIGS. 3, 4A, and 4B, an ink jet recording head II according to this embodiment is similar to the ink jet recording head I of the first embodiment shown in FIGS. 1, 2A, and 2B except that the supporting member 401 is modified. In this embodiment, the same components as those shown in FIGS. 1, 2A, and 2B are denoted by the same reference numerals, and a description thereof will be omitted.

As shown in FIGS. 3, 4A, and 4B, the supporting member 401 according to this embodiment is formed by bonding the rear surfaces of two supporting members 401*a* and 401*b*. When the two supporting members 401*a* and 401*b* are used, for example, the COF substrates 410 having the driving circuits 120 mounted thereon are bonded to the side surfaces of the supporting members 401*a* and 401*b*, and the lower ends of the substrates are bent so as to come into contact with the lower surfaces of the supporting members 401*a* and 401*b*. In this state, the COF substrates 410 bonded to the supporting members 401*a* and 401*b* are individually aligned with the lead electrodes 90. Then, the supporting members 401*a* and 401*b* are pushed against the conductive particles, thereby ensuring electrical connection between the lead electrodes 90 and the supporting members. Thereafter, the rear surfaces of the two supporting members 401*a* and 401*b* are bonded together to form one supporting member.

According to this embodiment, it is possible to individually adjust the alignment between the COF substrates 410 and the lead electrodes 90 at both sides of the supporting member 401. Therefore, it is possible to easily perform a predetermined alignment operation.

Other Embodiments

In the above-described embodiments, two rows of pressure generating chambers 12 are provided in the flow passage forming substrate 10, but the number of rows of pressure generating chambers is not limited to this configuration and any number of rows may be formed. For example, one or three or more rows of pressure generating chambers may be provided. When a plurality of rows of pressure generating chambers are provided, at least a set of two rows of pressure generating chambers may be provided opposite to each other.

Further, in the above-described embodiments, the supporting members 400 and 401 are pressed against the conductive particles. However, a member other than the supporting member may be used to press the conductive particles, and the wiring substrates may be fixed to supporting member after the pressing process.

Furthermore, in the above-described embodiments, the driving circuits 120 are mounted to the supporting members 400 and 401. However, in order to achieve high-density mounting without performing connection using a wire bonding method, the wiring substrates connected to the lead electrodes 90 may be supported by the supporting member 400 and 401 so as to be raised from the surface having the lead electrodes 90 provided thereon. In this case, the supporting members 400 and 401 may be formed in any shape, so long as they serve a supporting function. For example, the supporting member may have a lattice shape or a raft shape. However, when the supporting member is pushed to press the conductive particles, it is preferable that the lower surface of the supporting member be flat in order to apply a uniform pressing force. Alternatively, the driving circuits 120 may be directly mounted to the supporting members 400 and 401, and the wiring substrates may be connected to the surfaces of the driving circuits 120. In this case, the lower parts of the wiring substrates are bent to the sides opposite to the supporting members 400 and 401 and then connected to the lead electrodes 90.

The material forming the flow passage forming substrate 10 is not limited to that according to the above-described embodiments.

In the above-described embodiments, the ink jet recording head is given as an example of the liquid ejecting head. However, the invention can be applied to all kinds of liquid ejecting heads. For example, the invention may be applied to a liquid ejecting head that ejects liquid other than ink. Other examples of the liquid ejecting head include, for example, various kinds of recording heads used for image recording apparatuses, such as printers, a color material ejecting head used to manufacture, for example, a color filter of a liquid crystal display, an electrode material ejecting head used to form, for example, electrodes of an organic EL display or a field emission display (FED), and a bioorganic material ejecting head used to manufacture a biochip.

Figure 5:
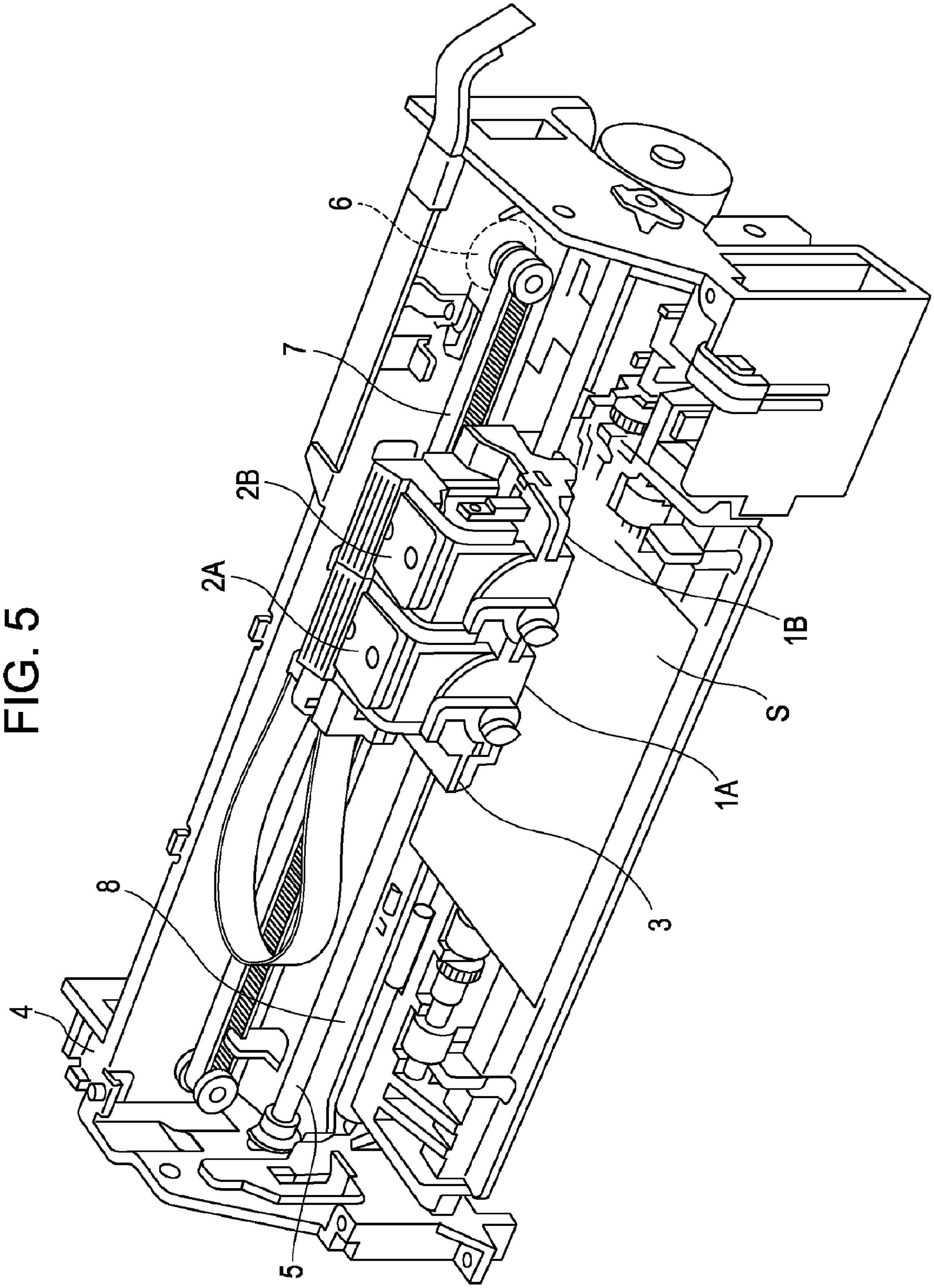
FIG. 5 is a perspective view illustrating a printer which includes a recording head described herein.

The ink jet recording head according to the above-described embodiments forms a portion of a recording head unit that has an ink flow passage communicating with, for example, an ink cartridge, and is provided in an ink jet recording apparatus. FIG. 5 is a diagram schematically illustrating an example of the ink jet recording apparatus. As shown in FIG. 5, recording head units 1A and 1B, each comprising a ink jet recording head I according to the above-described embodiment, are provided such that cartridges 2A and 2B forming an ink supply unit can be inserted into or removed from the recording head units. Additionally, a carriage 3 having the recording head units 1A and 1B mounted thereon is provided so as to be movable in the axial direction of a carriage shaft 5 attached to a main body 4. The recording head units 1A and 1B eject, for example, a black ink composition and a color ink composition, respectively.

The driving force of a driving motor 6 is transmitted to the carriage 3 through a plurality of gears (not shown) and a timing belt 7 to move the carriage 3 having the recording head units 1A and 1B mounted thereon along the carriage shaft 5. A platen 8 is provided along the carriage shaft 5 in the main body 4, and a recording sheet S, such as paper, which comprises a recording medium, is fed by, for example, a sheet feed roller (not shown). The sheet S is transported by the platen 8. The driving motor 6 or the pressure generating units of the recording head units 1A and 1B are controlled by a control unit (not shown) including, for example, a CPU and a memory.

What is claimed is:

1. A liquid ejecting head comprising:

a flow passage forming substrate including pressure generating chambers which are capable of communicating with nozzles for ejecting a liquid provided therein;

pressure generating elements capable of applying pressure to eject the liquid in the pressure generating chambers;

lead electrodes capable of supplying electric signals to the pressure generating elements;

wiring substrates capable of supplying the electric signals to the lead electrodes; and a supporting member that supports the wiring substrates so as to raise the wiring substrates from a surface of the liquid ejecting head having the lead electrodes provided thereon, wherein a buffer member is provided at one end of the supporting member, and a portion of the buffer member faces the region of the liquid ejecting head where the wiring substrates and the lead electrodes are connected to each other.

2. The liquid ejecting head according to claim 1, wherein the wiring substrates are connected to the lead electrodes by an anisotropic conductive layer.

3. The liquid ejecting head according to claim 1, further comprising:

driving circuits capable of applying a driving voltage to the pressure generating elements, wherein each of the driving circuits is mounted to the wiring substrate in a region facing the supporting member.

4. The liquid ejecting head according to claim 1, wherein one end of the supporting member is provided in a region of the liquid ejecting head where the wiring substrates and the lead electrodes are connected to each other.

5. The liquid ejecting head according to claim 1, wherein a plurality of rows of the pressure generating elements are provided opposite to each other, the supporting member being provided so as to correspond to the plurality of rows, and the wiring substrates are connected to the rows of lead electrodes and are each fixed to a different region of the supporting member.

6. The liquid ejecting head according to claim 1, wherein the supporting member is formed by bonding a plurality of supporting members together.

7. The liquid ejecting head according to claim 1, wherein a protective substrate is bonded to one surface of the flow passage forming substrate, the protective substrate having pressure generating element holding portions capable of holding the pressure generating elements, and one end of each of the lead electrodes is connected to a lower part of the wiring substrate and the other end of the lead electrode extends to the outside of the protective substrate.

8. A liquid ejecting apparatus comprising the liquid ejecting head according to claim 1.

9. A method of manufacturing a liquid ejecting head with wiring substrates electrically connected to lead electrodes in a liquid ejecting head member including a flow passage forming substrate that includes pressure generating chambers communicating with nozzles capable of ejecting a liquid provided therein, pressure generating elements capable of applying pressure which causes the liquid to the pressure generating chambers to be ejected from the nozzles, where the lead electrodes supply electric signals to the pressure generating elements, the method comprising:

fixing the wiring substrates to a supporting member to support the wiring substrates;

aligning the lead electrodes of the liquid ejecting head member with the wiring substrates;

pressing connecting portions between the aligned lead electrodes and the wiring substrates so as to electrically connect the lead electrodes and the wiring substrates; and providing a buffer member at one end of the supporting member, such that a portion of the buffer member faces a region of the liquid ejecting head member where the wiring substrates and the lead electrodes are connected to each other.

10. The method of manufacturing a liquid ejecting head according to claim 9, further comprising:

providing an anisotropic conductive layer between the lead electrodes and the wiring substrates before aligning the lead electrodes with the wiring substrates, wherein, pressing of the connecting portions between the lead electrodes and the wiring substrates comprises pushing the supporting member to press the connecting portions.

11. A method of manufacturing a liquid ejecting head, the method comprising:

forming a flow passage forming substrate including a plurality of pressure generating chambers which communicate with a plurality of nozzles capable of ejecting a liquid;

forming a plurality of pressure generating elements which correspond to the plurality of pressure generating chambers which are capable of applying pressure to the liquid within the pressure generating chambers in order to cause the liquid to be ejected from the nozzles, forming a series of lead electrodes capable of supplying electric signals to each of the pressure generating elements;

forming a supporting member on the flow passage forming substrate;

fixing wiring substrates to the supporting member so to support the wiring substrates;

aligning the lead electrodes of the liquid ejecting head member with the wiring substrates;

pressing connecting portions between the aligned lead electrodes and the wiring substrates so as to electrically connect the lead electrodes and the wiring substrates; and providing a buffer member at one end of the supporting member, such that a portion of the buffer member faces the region of the liquid ejecting head where the wiring substrates and the lead electrodes are connected to each other.

12. The method of manufacturing a liquid ejecting head according to claim 11, further comprising:

providing an anisotropic conductive layer between the lead electrodes and the wiring substrates before aligning the lead electrodes with the wiring substrates, wherein, pressing of the connecting portions between the lead electrodes and the wiring substrates comprises pushing the supporting member to press the connecting portions.

13. The method of manufacturing a liquid ejecting head according to claim 11, further comprising mounting driving circuits capable of applying a driving voltage to the pressure generating elements to the wiring substrate in a region facing the supporting member.

14. The method of manufacturing a liquid ejecting head according to claim 11, wherein one end of the supporting member is provided in a region of the liquid ejecting head where the wiring substrates and the lead electrodes are connected to each other.

15. The method of manufacturing a liquid ejecting head according to claim 14, wherein the pressure generating elements are comprise a plurality of symmetrical rows, the supporting member being provided so as to correspond to the plurality of rows, and the wiring substrates are connected to the rows of lead electrodes and are each fixed to a different region of the supporting member.

16. The method of manufacturing a liquid ejecting head according to claim 11, wherein the supporting member is formed by bonding a plurality of supporting members together.

17. The method of manufacturing a liquid ejecting head according to claim 11, further comprising bonding a protective substrate to one surface of the flow passage forming substrate, the protective substrate having pressure generating element holding portions capable of holding the pressure generating elements, wherein one end of each of the lead electrodes is connected to a lower part of the wiring substrate and the other end of the lead electrode extends to the outside of the protective substrate.

* * * * *